(12) United States Patent
Karaki et al.

(10) Patent No.: US 8,159,117 B2
(45) Date of Patent: Apr. 17, 2012

(54) DISPLAY APPARATUS AND PRODUCTION METHOD THEREOF

(75) Inventors: Tetsuya Karaki, Kawasaki (JP); Hideo Mori, Mobara (JP); Ryuichiro Isobe, Chiba (JP)

(73) Assignee: Canon Kabushiki Kaisha, Tokyo (JP)

( * ) Notice: Subject to any disclaimer, the term of this patent is extended or adjusted under 35 U.S.C. 154(b) by 155 days.

(21) Appl. No.: 12/521,933

(22) PCT Filed: Jan. 29, 2008

(86) PCT No.: PCT/JP2008/051714
§ 371 (c)(1),
(2), (4) Date: Jul. 1, 2009

(87) PCT Pub. No.: WO2008/093862
PCT Pub. Date: Aug. 7, 2008

(65) Prior Publication Data
US 2010/0039011 A1    Feb. 18, 2010

(30) Foreign Application Priority Data

Feb. 2, 2007 (JP) ................................. 2007-023825
Dec. 21, 2007 (JP) ................................. 2007-329822

(51) Int. Cl.
*H01J 1/62* (2006.01)
*H01J 63/04* (2006.01)

(52) U.S. Cl. ................ 313/1; 445/24; 445/25; 313/483; 313/495

(58) Field of Classification Search .................. None
See application file for complete search history.

(56) References Cited

U.S. PATENT DOCUMENTS 7,355,750 B2   4/2008 Saito et al.
7,365,890 B2   4/2008 Saito et al.
(Continued)

FOREIGN PATENT DOCUMENTS

JP    59-9636    1/1984
(Continued)

OTHER PUBLICATIONS

English machine translation of Yamaguchi et al (JP 2003-213401).*

*Primary Examiner* — Natalie Walford
(74) *Attorney, Agent, or Firm* — Fitzpatrick, Cella, Harper & Scinto

(57) ABSTRACT

There are provided a display apparatus that can display an image having higher resolution feeling while solving the problem of patterning precision for sub pixels which is difficult to obtain in production, and a production method thereof. The display apparatus includes a plurality of pixels disposed in two directions within a display surface and each having a sub pixel for emitting red light, two sub pixels for emitting green light, and a sub pixel for emitting blue light, wherein the sub pixel for emitting red light and the sub pixel for emitting blue light are disposed so as to partially overlap each other in one of the two directions, and the two sub pixels for emitting green light are disposed distant from each other in the one direction, wherein for the pixels adjacent to each other in the one direction, the sub pixels for emitting green light are adjacent to each other, and the sub pixel for emitting red light and the sub pixel for emitting blue light are adjacent to each other, and wherein the pixels adjacent to each other in the other of the two directions have the same sub pixel disposition.

8 Claims, 14 Drawing Sheets

U.S. PATENT DOCUMENTS

| | | |
|---|---|---|
| 7,379,080 B2 | 5/2008 | Asao et al. |
| 7,460,115 B2 | 12/2008 | Asao et al. |
| 2008/0151276 A1* | 6/2008 | Mori .............................. 358/1.9 |
| 2009/0046107 A1* | 2/2009 | Asao et al. .................... 345/597 |

FOREIGN PATENT DOCUMENTS

| | | |
|---|---|---|
| JP | 59-111196 | 6/1984 |
| JP | 61-56304 | 3/1986 |
| JP | 2-826 | 1/1990 |
| JP | 2-27322 | 1/1990 |
| JP | 9-318976 | 12/1997 |
| JP | 2003-213401 | 7/2003 |
| JP | 2005-154879 | 6/2005 |

* cited by examiner

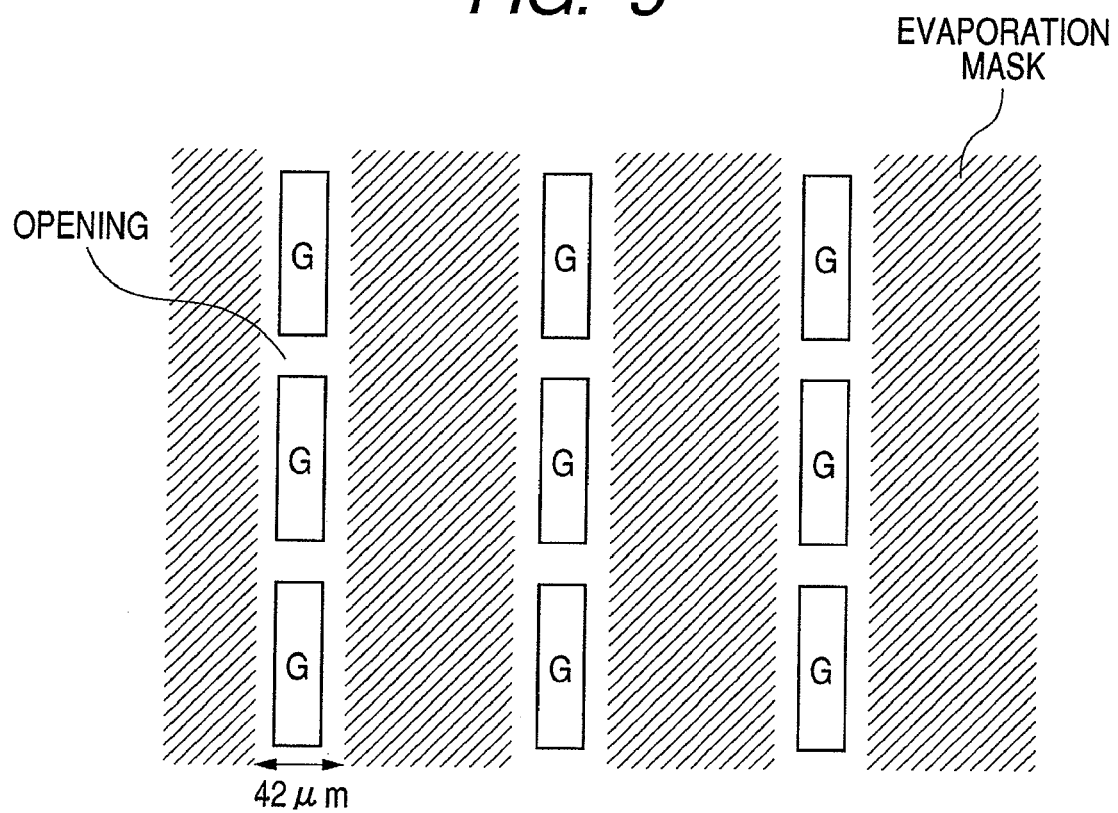

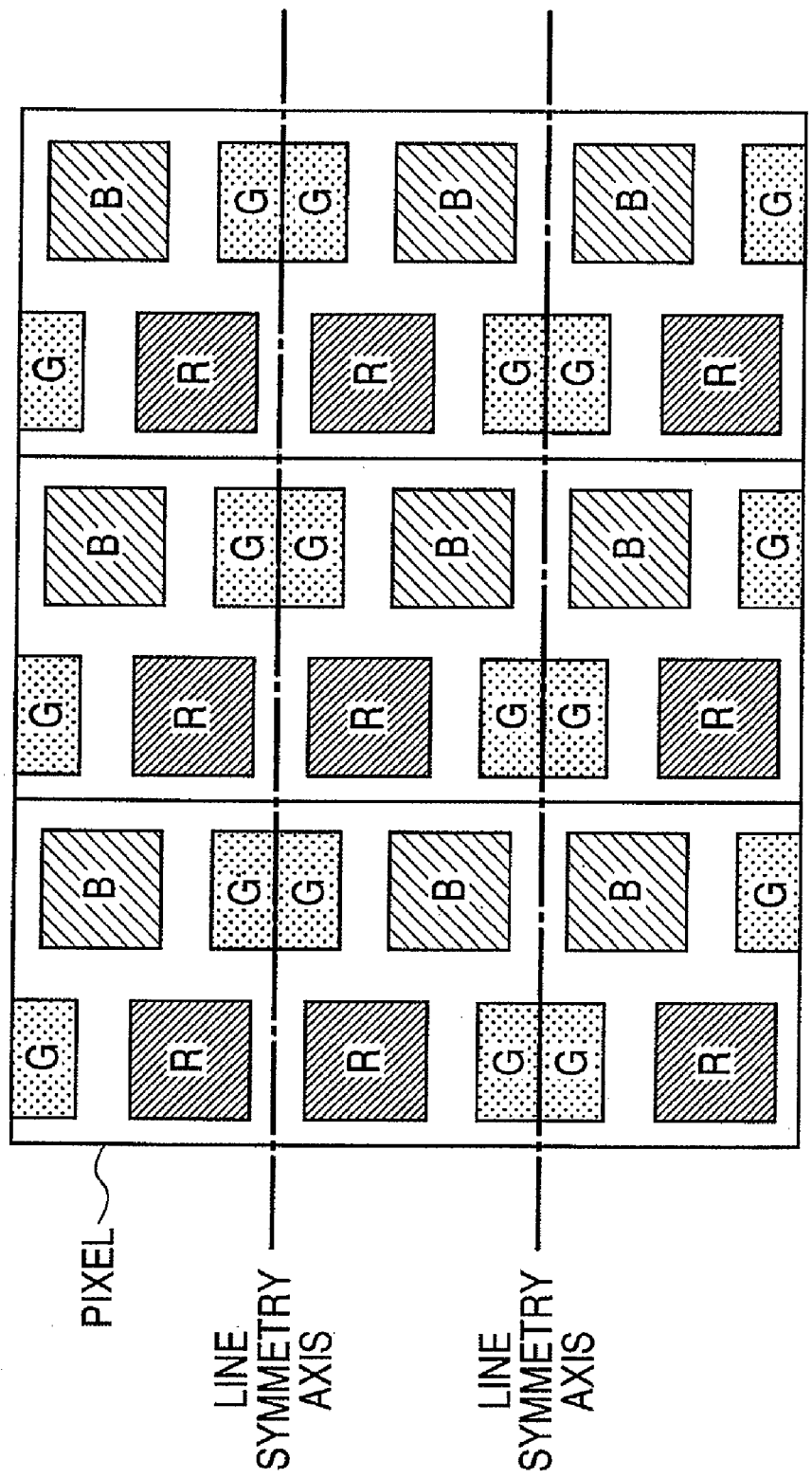

<RGB STRIPE>

<GRGB STRIPE>

X0 < X1

<RGB PIXEL>

<GRGB PIXEL>

X0 < X1

DISPLAY APPARATUS AND PRODUCTION METHOD THEREOF

TECHNICAL FIELD

The present invention relates to a display apparatus and a production method thereof.

BACKGROUND ART

According to a color display apparatus which is currently widely used, three primary colors (red (R), green (G), and blue (B)) are employed as one set and light quantities of the respective colors are adjusted to perform additive color mixing, thereby realizing color display.

Display is obtained as a group including light emission portions and non-light emission portions in a plurality of pixels. Each of the pixels has a sub pixel for emitting a red color (hereinafter, referred to as R sub pixel), a sub pixel for emitting a green color (hereinafter, referred to as G sub pixel), and a sub pixel for emitting a blue color (hereinafter, referred to as B sub pixel), that is, sub pixels for three primary colors. Various three-primary-color disposition methods have been proposed up to now. Known dispositions are as follows. For example, as illustrated in FIG. 11, there is a stripe disposition in which an R sub pixel, a G sub pixel, and a B sub pixel are repeatedly disposed in a horizontal direction and respective sub pixels are adjacent to each other in a vertical direction. As illustrated in FIG. 12, there is a mosaic disposition in which an R sub pixel, a G sub pixel, and a B sub pixel are repeatedly disposed in the horizontal direction and the respective sub pixels are disposed in the vertical direction so as to be offset with respect to each other by 1 pitch. As illustrated in FIG. 13, there is a delta disposition in which an R sub pixel, a G sub pixel, and a B sub pixel are repeatedly disposed in the horizontal direction and the respective pixels are disposed in the vertical direction so as to be offset with respect to each other by ½ pitch. Incidentally, the terms "horizontal direction" and "vertical direction" herein employed merely indicate directions in the drawing plane of the figure. In other words, the directions do not indicate the horizontal direction and the vertical direction of an actual display apparatus and may be reversed according to the type and manner of usage.

In addition to the above-mentioned dispositions, various dispositions are disclosed, for example, in Japanese Patent Application Laid-Open No. S61-056304.

In recent years, there has been a high-definition display apparatus whose resolution exceeds 200 ppi. In addition to the design of pixel and sub pixel disposition, reduction in pixel size and sub pixel size has proceeded. Therefore, a further increase in resolution has been desired.

When a higher-definition image is to be displayed in the conventional pixel disposition to satisfy the demand for the increase in resolution of the recent display apparatus, it is necessary to increase the number of pixels in a display region of the display apparatus. Therefore, a further reduction in pixel size is required.

However, when the conventional pixel size is to be further reduced, several adverse effects may be caused. For example, in the case of a display apparatus using a liquid crystal or a display apparatus using an organic EL material, there is a reduction in pixel aperture ratio. Even when the pixel size becomes smaller, the width of a wiring pattern for driving R, G, and B sub pixels included in each pixel does not change. Therefore, when a pixel area is reduced, the pixel aperture ratio, that is, a surface area of a pixel to a total area of a display region becomes smaller, so that the brightness of the display region reduces.

In the case of the organic EL device, when the respective sub pixels are to be separately formed by, for example, a vacuum evaporation method using a mask, the reduction in the size of each of the separately formed sub pixels, which corresponds to the reduction in pixel size, is made, therefore, the opening size of the mask needs to be reduced. For example, in the case of a display apparatus whose resolution in the horizontal direction is of 300 ppi, the pixel pitch in the horizontal direction becomes a small value of approximately 90 μm.

In the case of the stripe disposition illustrated in FIG. 14A, the sub pixel pitch is 30 μm as illustrated in FIG. 14B, so that the opening width of the mask is equal to or smaller than the sub pixel pitch. It is extremely difficult for the current technology to obtain the opening width by using a metal mask thin plate for etching. Even when the stripe disposition is provided by a plating method using a photolithography technique, it is necessary to generally ensure a mask evaporation deviation amount of ±10 μm in view of the opening precision and opening position precision. In the case of the stripe disposition illustrated in FIG. 14A, the interval between adjacent sub pixels in the horizontal direction is ensured to be 20 μm in view of the mask evaporation deviation amount and the driving wiring pattern. In this cases the pixel aperture ratio is extremely small. When the pixel aperture ratio reduces, the brightness of the display region can be maintained by increasing brightness of the sub pixels corresponding to the reduction in the pixel aperture ratio. However, particularly, in the case of the organic EL device, an adverse effect such as shortening of a life thereof, which corresponds to the increase in brightness, can be generated. Therefore, it is important to maximize the pixel aperture ratio when the display apparatus is designed.

Another method of increasing the resolution is a method of disposing, in each pixel, a plurality of G sub pixels having the highest visual sensitivity among the three-primary-color sub pixels as described in Japanese Patent Application Laid-Open Nos. H02-000826 and S59-111196. In a color display apparatus described in Japanese Patent Application Laid-Open No. S59-111196, an R sub pixel, a B sub pixel, and two G sub pixels are disposed in each pixel. The area of each of the G sub pixels is set to ½ of an area of each of the R sub pixel and the B sub pixel.

However, as illustrated in FIGS. 15A and 15B, when the number of G sub pixels in each pixel is merely increased, the pixel size increases (X0<X1), so that there is the case where the resolution is not increased as large as expected. Therefore, as illustrated in FIG. 16B, a method of reducing the size of the G sub pixel is disclosed.

However, even when the size of the G sub pixel is reduced, it is unavoidable that the pixel size in the disposition illustrated in FIG. 16B becomes larger than a pixel size in an RGB stripe disposition illustrated in FIG. 16A (X0<X1) because of the limit of the driving wiring pattern. As a result, a problem of the reduction in pixel aperture ratio and a problem of the difficulty of sub pixel patterning occur.

Even in the case where an R sub pixel, a B sub pixel, and two G sub pixels are disposed in each pixel as described in Japanese Patent Application Laid-Open No. S59-111196, when a higher-resolution image is to be displayed, a suitable disposition is required in view of sub pixel dispositions of adjacent pixels. A displayed image is evaluated in each of the horizontal direction, the vertical direction, and the oblique direction. In order to obtain higher resolution feeling, it is necessary to uniformly distribute the R sub pixels, the G sub pixels, and the B sub pixels in any of the horizontal direction, the vertical direction, and the oblique direction. According to the color display apparatus described in Japanese Patent Application Laid-Open No. S59-111196, although the two G sub pixels are disposed in each pixel to improve the resolution feeling, the disposition in which higher resolution feeling is obtained for each of the R sub pixel, the G sub pixel, and the B sub pixel is not made. When each G sub pixel is not adjacent to other G sub pixels as with the case of the color display apparatus described in Japanese Patent Application Laid-Open No. S59-111196 (see FIG. 3(2)), each G sub pixel is smaller than the conventional G sub pixels. Therefore, there is posed a problem that sub pixel patterning becomes more difficult because of the deviation of patterning position.

DISCLOSURE OF THE INVENTION

It is an object of the present invention to provide a display apparatus which can display an image having higher resolution feeling, while solving the problem of patterning precision for sub pixels, which is difficult to obtain in production of a display apparatus in which one each of R sub pixel and B sub pixel, and two G sub pixels are disposed in one pixel, and a method of producing the display apparatus.

In order to solve the above-mentioned problems, according to the present invention, there is provided a display apparatus, which includes:

a plurality of pixels disposed in two directions within a display surface, each of the plurality of pixels including a sub pixel for emitting a red light, two sub pixels for emitting a green light, and a sub pixel for emitting a blue light, wherein the sub pixel for emitting the red light and the sub pixel for emitting the blue light are disposed so as to partially overlap each other in one of the two directions, and the two sub pixels for emitting the green light are disposed distant from each other in the one direction, wherein for the pixels adjacent to each other in the one direction, the sub pixels for emitting the green light are adjacent to each other, and the sub pixel for emitting the red light and the sub pixel for emitting the blue light are adjacent to each other, and wherein the pixels adjacent to each other in the other of the two directions have the same sub pixel disposition.

Further, according to the present invention, there is also provided a method of producing a display apparatus which includes a plurality of pixels disposed in two directions within a display surface and each having a sub pixel for emitting a red light, two sub pixels for emitting a green light, and a sub pixel for emitting a blue light, wherein the sub pixel for emitting the red light and the sub pixel for emitting the blue light are disposed so as to partially overlap each other in one of the two directions, and the two sub pixels for emitting the green light are disposed distant from each other in the one direction, and wherein for the pixels adjacent to each other in the one direction, the sub pixels for emitting the green light are adjacent to each other, the method including forming the sub pixels for emitting the green light by using a mask having an opening which is common to the adjacent sub pixels for emitting the green light.

According to the present invention, the higher resolution feeling can be more improved without a reduction in pixel size. Even when the pixel size is reduced to advance the realization of high definition, the problem of the sub pixel patterning precision which is difficult to obtain in production can be solved. Therefore, the reduction in pixel aperture ratio can be minimized.

BRIEF DESCRIPTION OF THE DRAWINGS

FIG. 5 is a schematic plan view illustrating an example of an evaporation mask for the organic EL display apparatus produced for comparison.

FIG. 9 is a schematic plan view illustrating a pixel disposition and a sub pixel disposition of an organic EL display apparatus according to Example 3 of the present invention.

BEST MODE FOR CARRYING OUT THE INVENTION

Hereinafter, the present invention will be described with reference to examples. A display apparatus and a production method thereof according to the present invention are not limited by the examples. In other words, the present invention can be embodied not only for an organic EL display apparatus but also for display apparatuses such as a liquid crystal display apparatus (LCD), a plasma display apparatus (PDP), and a field emission display apparatus (FED).

EXAMPLE 1

Figure 1:
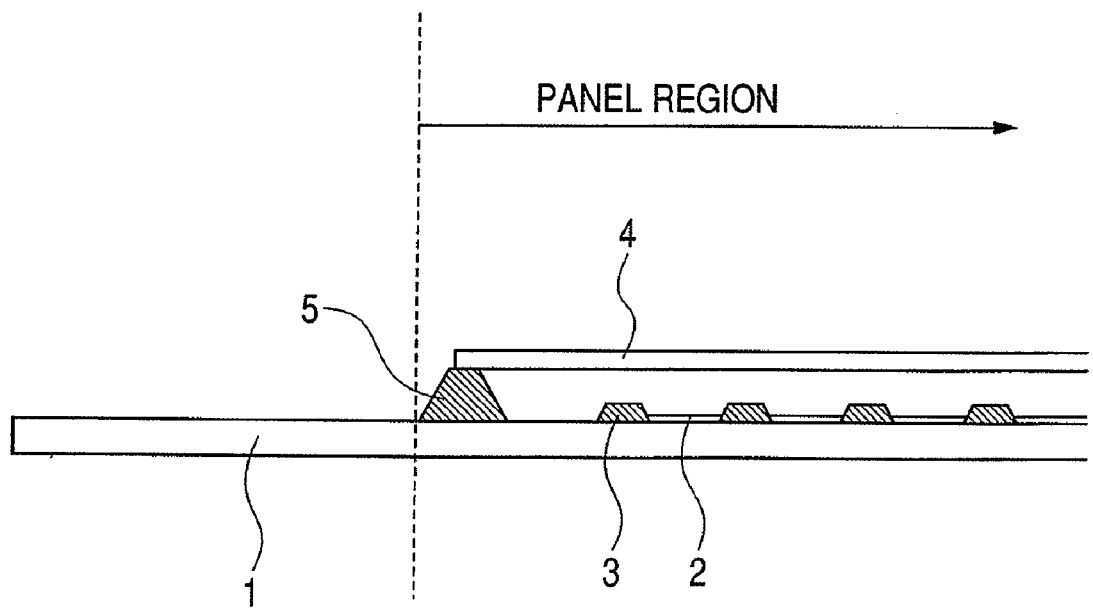
FIG. 1 is a schematic cross sectional view illustrating an organic EL display apparatus to which the present invention can be applied.

An organic EL display apparatus having a structure illustrated in FIG. 1 was produced.

Thin film transistors (TFTs), electrode wirings, and pixel electrodes, which are not shown, are formed in a matrix pattern on a substrate 1 illustrated in FIG. 1. One of glass, quartz, and a plastic film such as polyethylene terephthalate (PET), polycarbonate (PC), or polyethersulfone (PES) can be used for the substrate 1.

An organic compound for a light-emitting layer is formed on each of the pixel electrodes. An upper electrode is formed on the light-emitting layer. A protective film is formed on the upper electrode in some cases. In this example, the pixel electrodes, the organic compounds, and the upper electrodes, which are formed in a matrix pattern, compose a plurality of organic EL light-emitting portions (sub pixels) 2. The organic compounds for R, G, and B sub pixels are formed by evaporation to the organic EL light-emitting portions 2.

The respective organic EL light-emitting portions 2 are separated from one another by pixel banks 3 having apertures in two directions within a display surface. The pixel banks 3 may be made of the same material as the substrate 1 or a photosensitive resin such as an acrylic resin. As a method of forming the pixel banks 3, for example, a method of applying a photosensitive resin layer and then performing exposure and wet development can be used. Alternatively, there is a method of bonding separately formed pixel banks to the substrate. There is also a method of integrally forming the pixel banks 3 and the substrate 1 by molding. There is further a formation method using a printing method. Methods other than the above-mentioned methods may be used to form the pixel banks 3.

A protective film 4 for protecting the organic EL light-emitting portions 2 is disposed over the organic EL light-emitting portions 2. The protective film 4 is disposed to the substrate 1 using a sealing member 5.

In other words, substantially as with a generally-used organic EL display apparatus, the organic EL display apparatus includes a plurality of pixels disposed in a matrix pattern in the two directions within the display surface. Each of the pixels includes an R sub pixel, G sub pixels, and a B sub pixel. There is a key feature on pixel and sub pixel disposition.

Figure 2A:
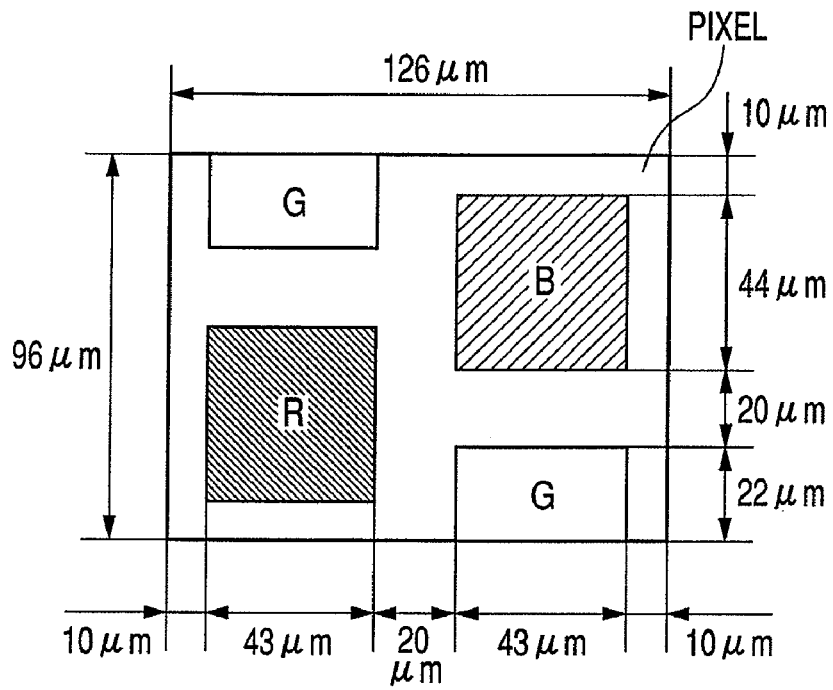
FIG. 2A is a schematic plan view illustrating a sub pixel disposition of an organic EL display apparatus according to Example 1 of the present invention and FIG. 2B is a schematic plan view illustrating a pixel disposition thereof.
Figure 2B:
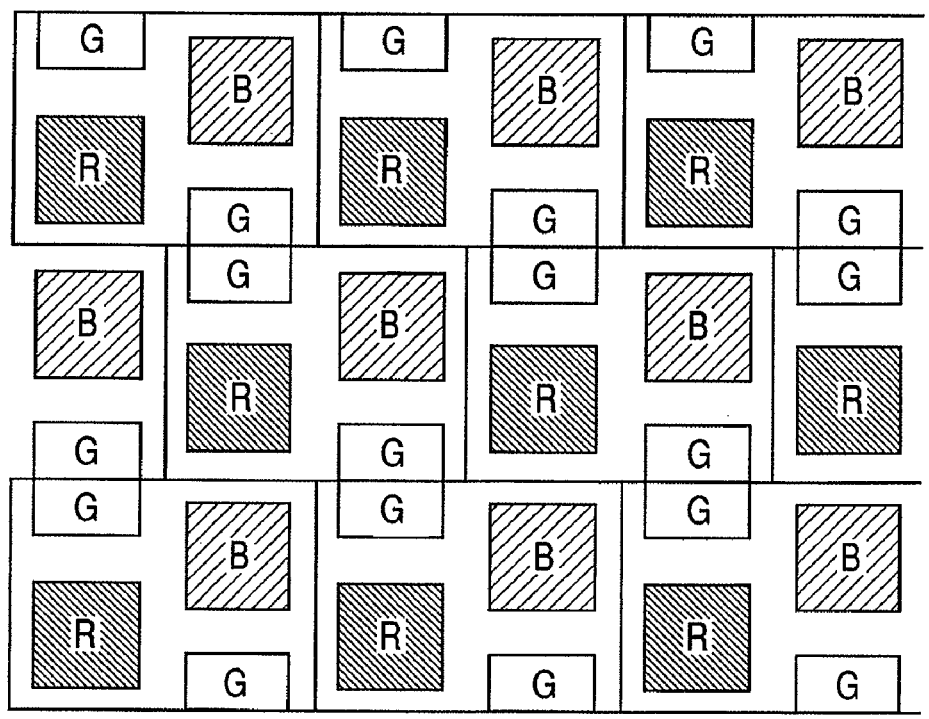

FIGS. 2A and 2B illustrate the pixel and sub pixel disposition of the organic EL display apparatus. As illustrated in FIG. 2A, each of the pixels includes an R sub pixel, two G sub pixels, and a B sub pixel. The R sub pixel and the B sub pixel are disposed within each pixel (126 μm×96 μm in size) in diagonal positions so as to partially overlap with each other in any one of the two directions (vertical direction in this example) within the display surface. The two G sub pixels are disposed within each pixel in diagonal positions and distant from each other in the vertical direction.

Incidentally, the expression "the R sub pixel and the B sub pixel partially overlap with each other in the vertical direction" herein employed means that the R sub pixel and the B sub pixel partially overlap with each other when the R sub pixel is shifted in the horizontal direction toward the B sub pixel. In addition, the expression "the two G sub pixels are distant from each other in the vertical direction" herein employed means that the two G sub pixels are distant from each other without overlapping when one of the G sub pixels is shifted in the horizontal direction toward the other of the G sub pixels.

With respect to other pixels adjacent to each other in the vertical direction, G sub pixels are adjacent to each other, an R sub pixel is adjacent to a B sub pixel, and a B sub pixel is adjacent to an R sub pixel. With respect to other pixels adjacent to each other in the other of the two directions within the display surface, that is, in the horizontal direction, the same sub pixel disposition is employed, in other words, three-color sub pixels are disposed in the same manner.

The interval between one of the R sub pixel and the B sub pixel and a sub pixel adjacent thereto in one of the horizontal direction and the vertical direction is ensured to be 20 μm in view of production precision of an evaporation mask and a driving wiring pattern. As illustrated in FIG. 2B, a disposition in which an interval between the G sub pixels adjacent to each other in the vertical direction is not ensured, that is, a disposition in which the adjacent G sub pixels are in contact with each other, is employed. Such a sub pixel disposition can be made because the two G sub pixels adjacent to each other in the vertical direction are formed by a commonly used opening of the evaporation mask as described later.

As a result, the pixels adjacent to each other in the vertical direction have the same sub pixel disposition. The pixel disposition is such that the pixels adjacent to each other in the vertical direction are offset with respect to each other by a ½ pixel pitch in the horizontal direction.

In order to produce the R sub pixels, the G sub pixels, and the B sub pixels, the organic compound layers (organic light-emitting layers) are formed for respective emission colors on the substrate including the pixels by vacuum evaporation and patterning using a mask in which openings are formed (metal mask). In particular, the two G sub pixels adjacent to each other in the vertical direction are formed by a commonly used mask opening. Therefore, even when the G sub pixel is small, an allowable range of a patterning position deviation such as a mask alignment accuracy or a film formation error is widened because the mask opening has an area approximately two times an area of the G sub pixel.

Further, in this example, the two G sub pixels are formed by patterning using the single mask opening, so that mask opening patterns corresponding to three-color sub pixels are equal to each other. Therefore, one kind of mask is desirably prepared, with the result that a large effect for reducing a production cost is obtained.

Moreover, when the mask disposition (alignment) is controlled, the three-color sub pixels can be formed by patterning using the single mask without mask exchange for each emission color. Therefore, the time required for mask exchange can be reduced. This leads not only to the reduction in production cost but also to a shortening of tact time.

Figure 3:
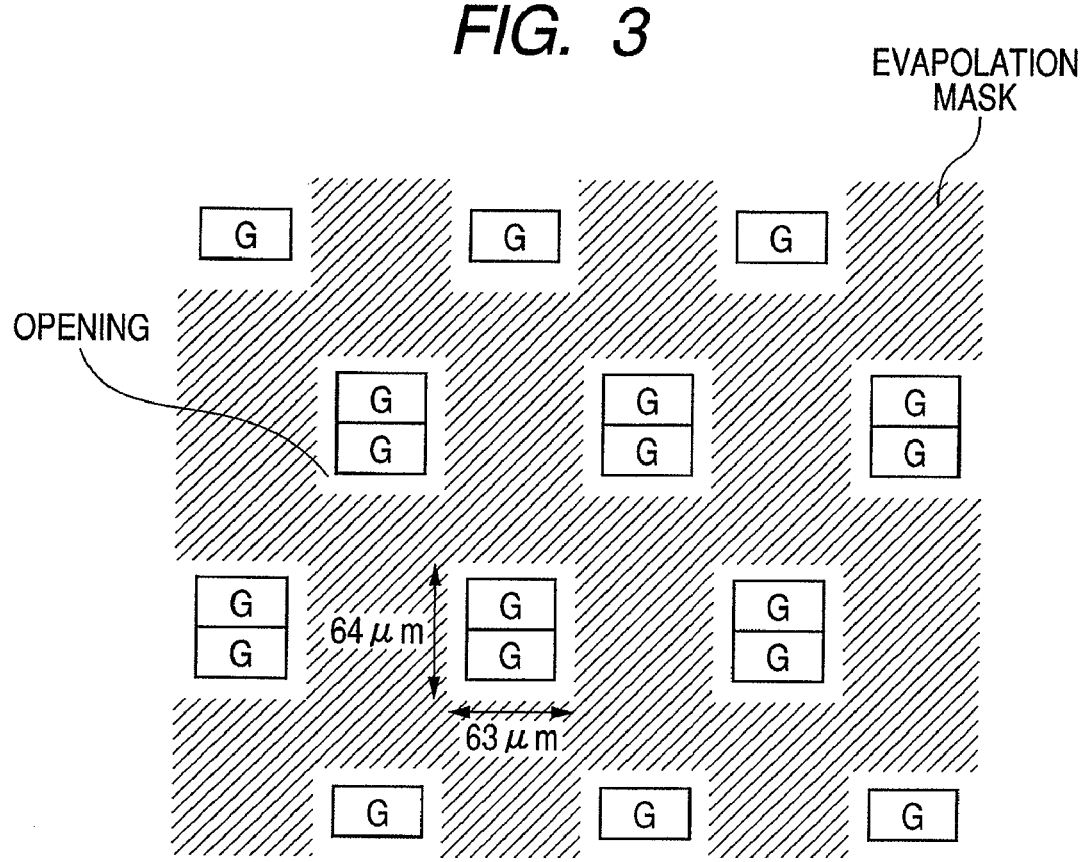
FIG. 3 is a schematic plan view illustrating an example of an evaporation mask for the organic EL display apparatus according to Example 1 of the present invention.

FIG. 3 illustrates a detail of a metal mask. As illustrated in FIG. 3, an opening size of the metal mask is 63 μm×64 μm. The metal mask can be designed and produced using conventional technology. The metal mask was produced by an etching method using an Invar thin plate whose thickness is 30 μm.

Comparative Example 1

Figure 4A:
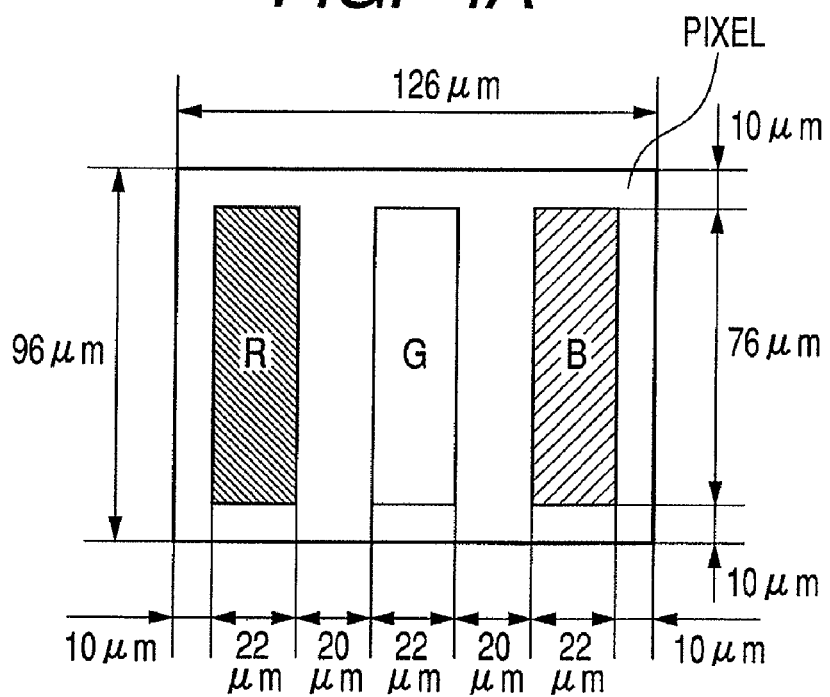
FIG. 4A is a schematic plan view illustrating a sub pixel disposition of an organic EL display apparatus produced for comparison and FIG. 4B is a schematic plan view illustrating a pixel disposition thereof.
Figure 4B:
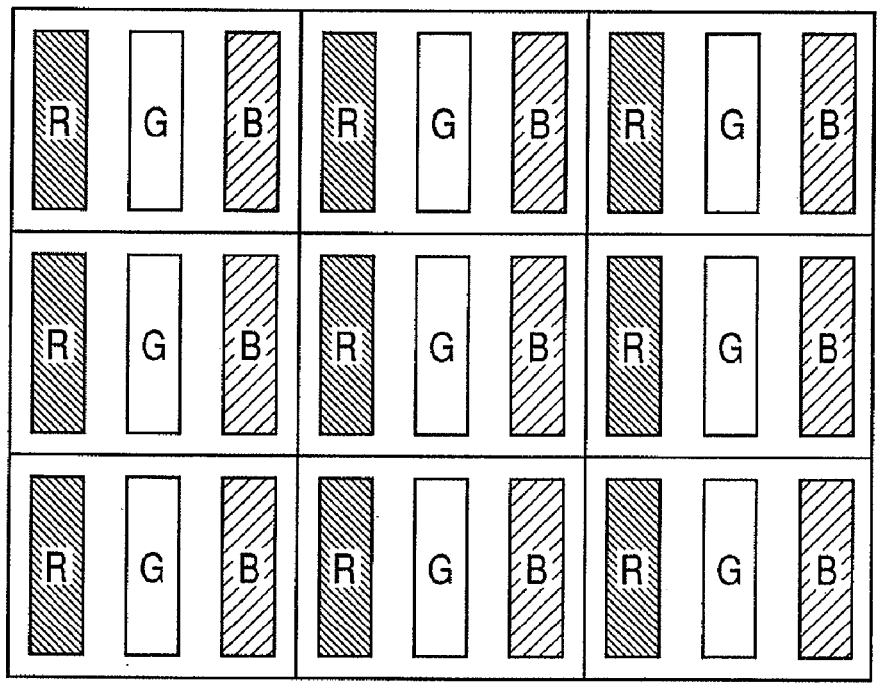

In order to confirm the superiority of the display apparatus according to the present invention, an RGB stripe organic EL display apparatus according to Comparative Example 1 as illustrated in FIGS. 4A and 4B was produced. The pixel size was set to 126 μm×96 μm, which was equal to the size in Example 1 of the present invention. The sub pixel interval of 20 μm was ensured as in Example 1 of the present invention.

FIG. 5 illustrates a detail of an evaporation mask for forming (separately depositing) the sub pixels illustrated in FIGS. 4A and 4B. As illustrated in FIG. 5, a stripe mask with an opening width of 42 μm was produced by an etching method using an Invar thin plate of 30 μm in thickness.

(Evaluation)

In order to confirm the superiority of the pixel and sub pixel disposition in the present invention, a circular zone plate (hereinafter, simply referred to as CZP) image was displayed as an evaluation image on the produced organic EL display apparatus and evaluated. The CZP was originally designed to measure frequency characteristics of an optical device such as a camera. The CZP is a two-dimensional representation of a sine (or cosine) curve in which a number of concentric circles are arranged around the center of the image serving as an origin, the spatial frequency is increased from the center to the outside to decrease the pitch.

According to Fukinuki Takahiko, "Digital signal processing of images (enlarged edition)" published by The Nikkan Kogyo Shimbun, Ltd., p. 293, when the CZP image is used, two-dimensional frequency characteristics of a display system can be visually recognized. Evaluation results are shown in Tables 1 to 3. In Tables 1 to 3, the evaluation result of the display structure of Comparative Example 1, that is, the evaluation structure of the RGB stripe is expressed by "Δ", the case where the effect is large is expressed by "□", the case where the effect is recognized is expressed by "○", and the case where the effect deteriorates is expressed by "x".

TABLE 1

Evaluation result of CZP image of green (G) component

| Green component | Example 1 | Comparative Example 1 |
|---|---|---|
| Horizontal direction | □ | Δ |
| Vertical direction | Δ | Δ |
| Oblique direction | ○ | Δ |

TABLE 2

Evaluation result of CZP image of red (R) component

| Red component | Example 1 | Comparative Example 1 |
|---|---|---|
| Horizontal direction | ○ | Δ |
| Vertical direction | Δ | Δ |
| Oblique direction | ○ | Δ |

TABLE 3

Evaluation result of CZP image of blue (B) component

| Red component | Example 1 | Comparative Example 1 |
|---|---|---|
| Horizontal direction | ○ | Δ |
| Vertical direction | Δ | Δ |
| Oblique direction | ○ | Δ |

As shown in Table 1, when CZP images of green components of the produced two organic EL display apparatuses are compared with each other, it was found that an alias image in the horizontal direction which had generated in the conventional RGB stripe (Comparative Example 1) did not occur in Example 1. This means that the horizontal resolution of the green component which was obtained by the pixel and sub pixel disposition in the present invention was higher. In Example 1, a reduction in alias image caused in the oblique direction was recognized.

Further, as shown in Tables 2 and 3, in any of Comparative Example 1 and Example 1, similar alias image was caused in the vertical direction in the case of the red component and the blue component. However, according to Example 1, an effect was confirmed in which alias image in each of the horizontal direction and the oblique direction was reduced.

From the results, it was confirmed that the pixel and sub pixel disposition in the present invention had better horizontal frequency characteristics than the pixel and sub pixel disposition of the RGB stripe which had conventionally been, in particular, in the case of the green component by which a spatial frequency that could be detected by human beings was greatly affected.

EXAMPLE 2

Figure 6:
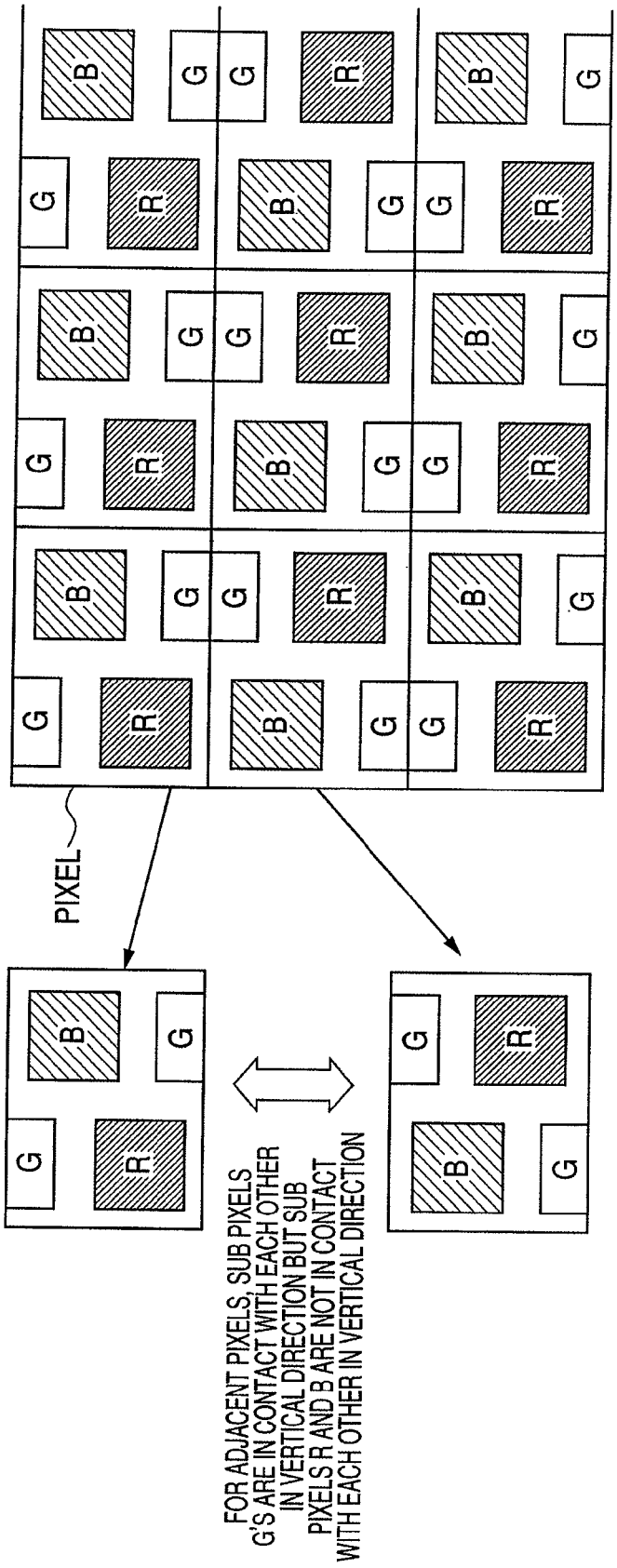
FIG. 6 is a schematic plan view illustrating a pixel disposition and a sub pixel disposition of an organic EL display apparatus according to Example 2 of the present invention.

In order to confirm the superiority of the pixel and sub pixel disposition in the present invention, an image modeling a display panel having the pixel and sub pixel disposition in the present invention as illustrated in FIG. 6 was produced on a positive color film by exposure.

As illustrated in FIG. 6, the R sub pixel and the B sub pixel are disposed within each pixel in diagonal positions so as to partially overlap each other in any one of the two directions (vertical direction in this example) within the display surface. The two G sub pixels are disposed within each pixel in diagonal positions and distant from each other in the vertical direction.

With respect to other pixels adjacent to each other in the vertical direction, G sub pixels are adjacent to each other, an R sub pixel is adjacent to a B sub pixel, and a B sub pixel is adjacent to an R sub pixel. With respect to other pixels adjacent to each other in the other of the two directions within the display surface, that is, in the horizontal direction, the same sub pixel disposition is employed, in other words, three-color sub pixels are disposed in the same manner. In other words, the same sub pixel disposition as Example 1 is employed.

The pixels adjacent to each other in the vertical direction have sub pixel dispositions reverse to each other in the horizontal direction. With respect to the pixel disposition, the pixels adjacent to each other in the vertical direction are disposed in a grid pattern without offset of a pixel pitch in the horizontal direction.

In Examples 1 and 2, the same sub pixel disposition is employed, but positions for pixel separation are different from each other. Both of the separation methods have the same mask evaporation step. Any one of the both separation methods may be employed for the present invention.

The image used was obtained by converting the resolution of an SD quality image into a resolution suitable for each pixel disposition. An ectachrome output file manufactured by Kodak Co. was used as the positive color film. The evaluation image was exposed and developed by a film recorder LVT manufactured by Kodak Co. After the development, the film was placed on a light box and visually observed at a distance of 30 cm to 50 cm as a visual distance equal to an actual panel observation condition. An image is used as the evaluation image.

The result was good as in the case with Example 1.

Comparative Example 2

Figure 7:
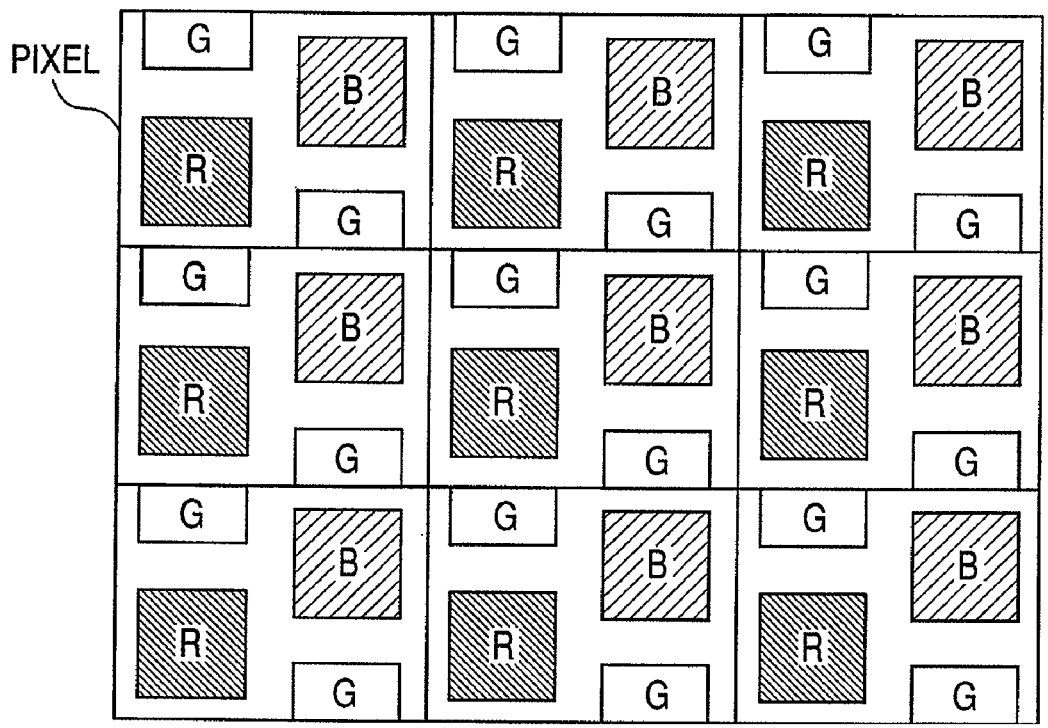
FIG. 7 is a schematic plan view illustrating a pixel disposition and a sub pixel disposition of an organic EL display apparatus according to Comparative Example 2 of the present invention.

In order to confirm the superiority of the pixel and sub pixel disposition in the present invention, an image modeling a display panel having the pixel and sub pixel disposition in the present invention as illustrated in FIG. 7 was produced on a positive color film by exposure.

As illustrated in FIG. 7, the sub pixel disposition within each pixel is equal to the sub pixel disposition in Example 1. In other words, the pixels which are adjacent to each other in the vertical direction have the same sub pixel disposition. With respect to the pixel disposition, the pixels adjacent to each other in the vertical direction are disposed in a grid pattern without offset of a pixel pitch in the horizontal direction.

The image used was obtained by converting the resolution of an SD quality image into a resolution suitable for each pixel disposition. An ectachrome output file manufactured by Kodak Co. was used as the positive color film. The evaluation image was exposed and developed by a film recorder LVT manufactured by Kodak Co. After the development, the film was placed on a light box and visually observed at a distance of 30 cm to 50 cm as a visual distance equal to an actual panel observation condition. An image is used as the evaluation image.

(Evaluation)

In order to confirm the superiority of the pixel and sub pixel disposition in the present invention, a CZP image was displayed as an evaluation image on the produced positive color film. In other words, the positive color film of Example 2 of the present invention was compared with the positive color film of Comparative Example 2.

The evaluation results are shown in Tables 4 to 6. In Tables 4 to 6, the evaluation result of the display structure of Comparative Example 2, that is, the evaluation result of the RGB stripe is expressed by "Δ", the case where the effect is large is expressed by "□", the case where the effect is recognized is expressed by "○", and the case where the effect deteriorates is expressed by "x".

TABLE 4

Evaluation result of CZP image of green (G) component

| Green component | Example 2 | Comparative Example 2 |
| --- | --- | --- |
| Horizontal direction | Δ | Δ |
| Vertical direction | Δ | Δ |
| Oblique direction | ○ | Δ |

TABLE 5

Evaluation result of CZP image of red (R) component

| Red component | Example 2 | Comparative Example 2 |
| --- | --- | --- |
| Horizontal direction | ○ | Δ |
| Vertical direction | Δ | Δ |
| Oblique direction | ○ | Δ |

TABLE 6

Evaluation result of CZP image of blue (B) component

| Red component | Example 2 | Comparative Example 2 |
| --- | --- | --- |
| Horizontal direction | ○ | Δ |
| Vertical direction | Δ | Δ |
| Oblique direction | ○ | Δ |

As shown in Table 4, when CZP images of green components of the produced two organic EL display apparatuses were compared with each other, it was found that an alias image in the oblique direction in Example 2 was smaller than that in Comparative Example 2. This means that the oblique resolution feeling of the green component, which was obtained by the pixel and sub pixel disposition in Example 2, was higher.

Further, as shown in Tables 5 and 6, in any of Comparative Example 2 and Example 2, similar alias image was caused in the vertical direction in the case of each of the red component and the blue component. However, according to Example 2, an effect was confirmed in which alias image in each of the horizontal direction and the oblique direction was reduced.

Comparative Example 3

Figure 8:
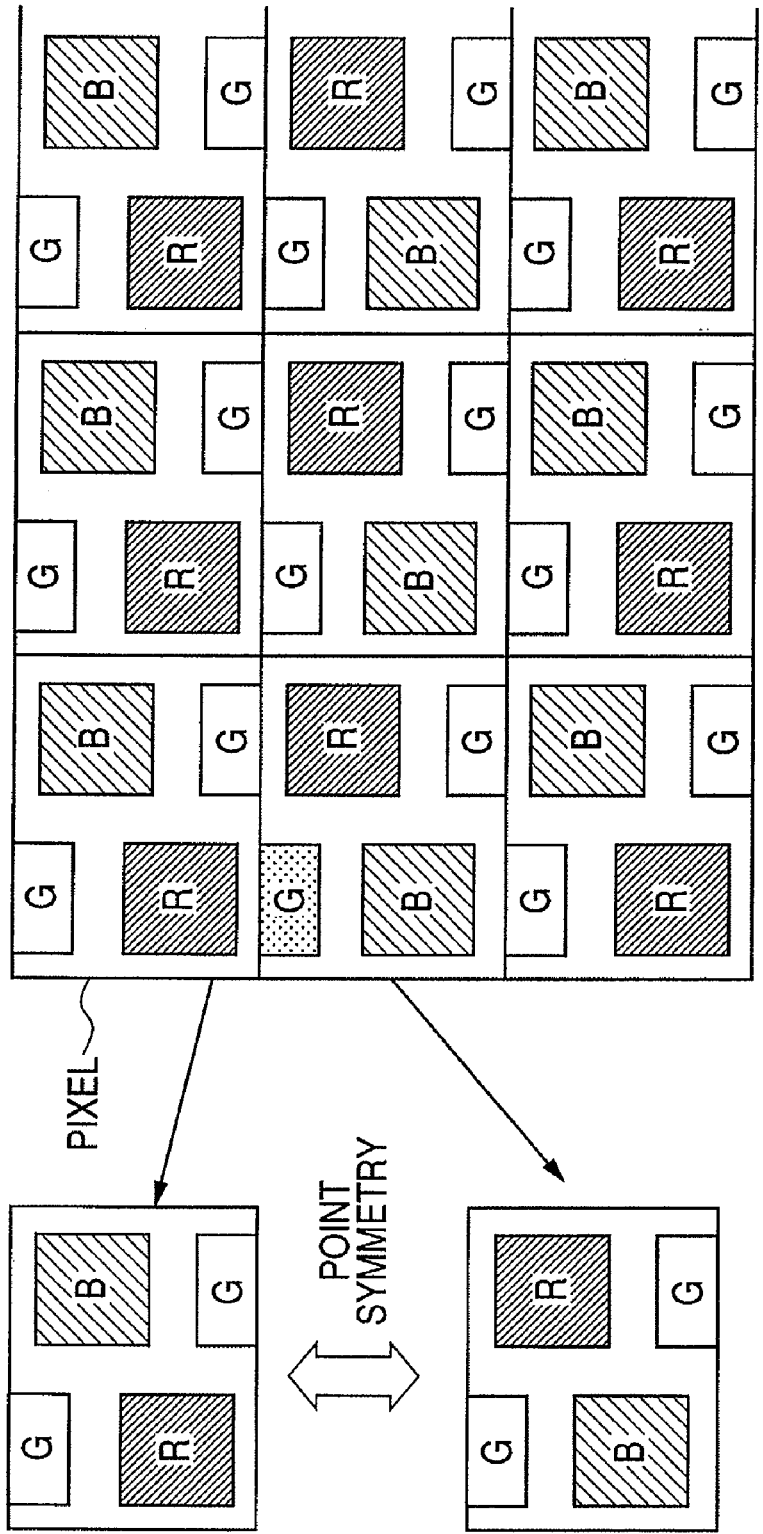
FIG. 8 is a schematic plan view illustrating a pixel disposition and a sub pixel disposition of an organic EL display apparatus according to Comparative Example 3 of the present invention.

In order to confirm the superiority of the pixel and sub pixel disposition in the present invention, an image modeling a display panel having the pixel and sub pixel disposition in the present invention as illustrated in FIG. 8 was produced on a positive color film by exposure.

As illustrated in FIG. 8, with respect to the sub pixel disposition of pixels adjacent to each other in the vertical direction, the pixels are disposed in a matrix pattern to attain point symmetrical sub pixel disposition. In other words, the pixels adjacent to each other in the vertical direction have sub pixel dispositions reverse to each other in the vertical and horizontal directions. With respect to the pixel disposition, the pixels adjacent to each other in the vertical direction are disposed in a grid pattern without offset of a pixel pitch in the horizontal direction.

The image used was obtained by converting the resolution of an SD quality image into a resolution suitable for each pixel disposition. An ectachrome output file manufactured by Kodak Co. was used as the positive color film. The evaluation image was exposed and developed by a film recorder LVT manufactured by Kodak Co. After the development, the film was placed on a light box and visually observed at a distance of 30 cm to 50 cm as a visual distance equal to an actual panel observation condition. An image is used as the evaluation image.

(Evaluation)

In order to confirm the superiority of the pixel and sub pixel dispositions in the present invention, a CZP image was displayed as an evaluation image on the produced positive color film. In other words, the positive color film of Example 2 of the present invention was compared with the positive color film of Comparative Example 3.

The evaluation results are shown in Tables 7 to 9. In Tables 7 to 9, the evaluation result of the display structure of Comparative Example 3, that is, the evaluation result of the RGB stripe is expressed by "Δ", the case where the effect is large is expressed by "□", the case where the effect is recognized is expressed by "○", and the case where the effect deteriorates is expressed by "x".

TABLE 7

Evaluation result of CZP image of green (G) component

| Green component | Example 2 | Comparative Example 3 |
| --- | --- | --- |
| Horizontal direction | Δ | Δ |
| Vertical direction | Δ | Δ |
| Oblique direction | ○ | Δ |

TABLE 8

Evaluation result of CZP image of red (R) component

| Red component | Example 2 | Comparative Example 3 |
| --- | --- | --- |
| Horizontal direction | Δ | Δ |
| Vertical direction | ○ | Δ |
| Oblique direction | ○ | Δ |

TABLE 9

Evaluation result of CZP image of blue (B) component

| Red component | Example 2 | Comparative Example 3 |
|---|---|---|
| Horizontal direction | Δ | Δ |
| Vertical direction | ○ | Δ |
| Oblique direction | ○ | Δ |

As shown in Table 7, when CZP images of green components of the produced two organic EL display apparatuses were compared with each other, it was found that an alias image in the oblique direction in Example 2 was smaller than that in Comparative Example 3. This means that the oblique resolution feeling of the green component, which was obtained by the pixel and sub pixel disposition in Example 2, was higher.

Further, as shown in Tables 8 and 9, in any of Comparative Example 3 and Example 2, similar alias image was caused in the horizontal direction in the case of each of the red component and the blue component. However, according to Example 2, an effect was confirmed in which alias image in each of the vertical direction and the oblique direction was reduced in any of the red component and the blue component.

EXAMPLE 3

In order to confirm the superiority of the pixel and sub pixel disposition in the present invention, an image modeling a display panel having the pixel and sub pixel dispositions in the present invention as illustrated in FIG. 9 was produced on a positive color film by exposure.

As illustrated in FIG. 9, with respect to the sub pixel disposition of pixels adjacent to each other in the vertical direction, line symmetry about a boundary line between the adjacent pixels as a symmetry axis is employed. In other words, the pixels adjacent to each other in the vertical direction have sub pixel dispositions reverse to each other in the vertical direction. With respect to the pixel disposition, the pixels adjacent to each other in the vertical direction are disposed in a grid pattern without offset of a pixel pitch in the horizontal direction.

In this example, the pixels adjacent to each other in the vertical direction are disposed in the grid pattern without offset of the pixel pitch in the horizontal direction. According to the present invention, as in Example 1, the pixels adjacent to each other in the vertical direction may be disposed so as to be offset with respect to each other by ½ pixel pitch in the horizontal direction. In this case, the pixels adjacent to each other in the vertical direction have sub pixel dispositions reverse to each other in the vertical and horizontal directions.

The image used was obtained by converting the resolution of an SD quality image into a resolution suitable for each pixel disposition. An ectachrome output file manufactured by Kodak Co. was used as the positive color film. The evaluation image was exposed and developed by a film recorder LVT manufactured by Kodak Co. After the development, the film was placed on a light box and visually observed at a distance of 30 cm to 50 cm as a visual distance equal to an actual panel observation condition. An image is used as the evaluation image.

For the result, as compared with Example 2, the same evaluation result was obtained with respect to the G component. However, with respect to the R component and the B component, an alias image was outstanding in any of the horizontal direction, the vertical direction, and the oblique direction.

A method of producing the organic EL display apparatus having the pixel and sub pixel disposition according to this example will be described.

The R sub pixels, G sub pixels, and B sub pixels are formed by patterning organic compound layers (organic light-emitting layers) for each emission color on a substrate having pixels by vacuum evaporation using a mask having openings formed therein (metal mask). In particular, the two G sub pixels adjacent to each other in the vertical direction are formed by a single common mask opening. Therefore, even when the G sub pixel is small, because the mask opening has an area approximately two times an area of the G sub pixel, an allowable range of a patterning position deviation such as a mask alignment accuracy or a film formation error is widened. The same mask as the mask illustrated in FIG. 3 can be used as the mask for forming the G sub pixel.

Figure 10A:
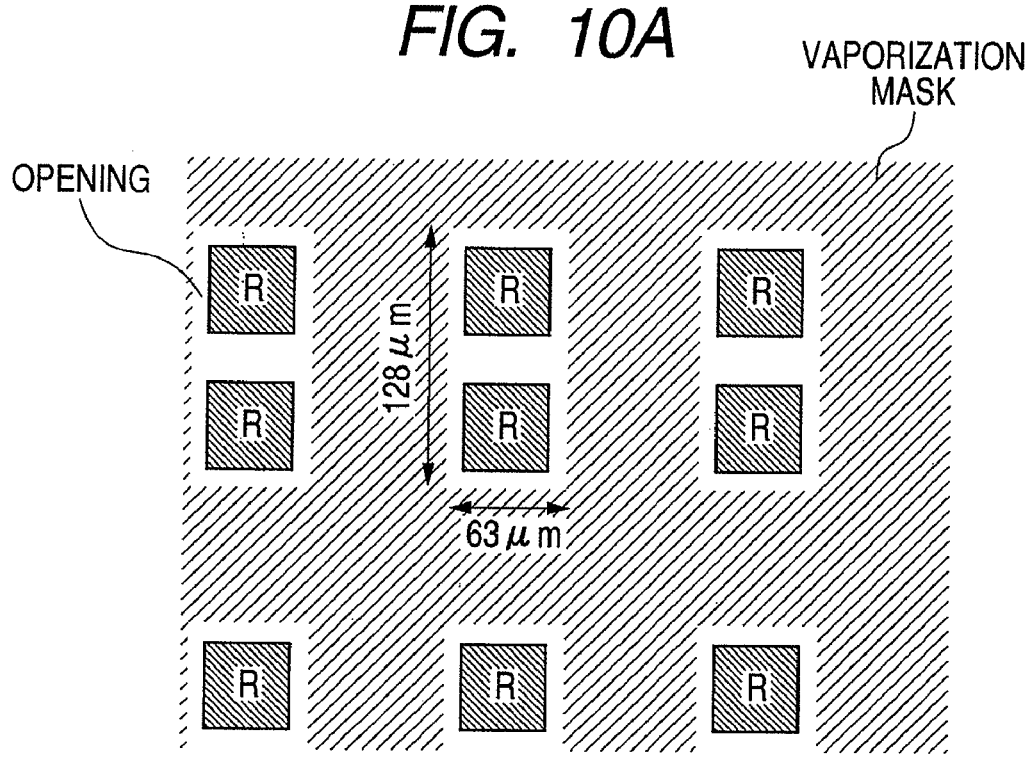
FIGS. 10A and 10B are schematic plan views illustrating an example of an evaporation mask for the organic EL display apparatus according to Example 3 of the present invention.
Figure 10B:
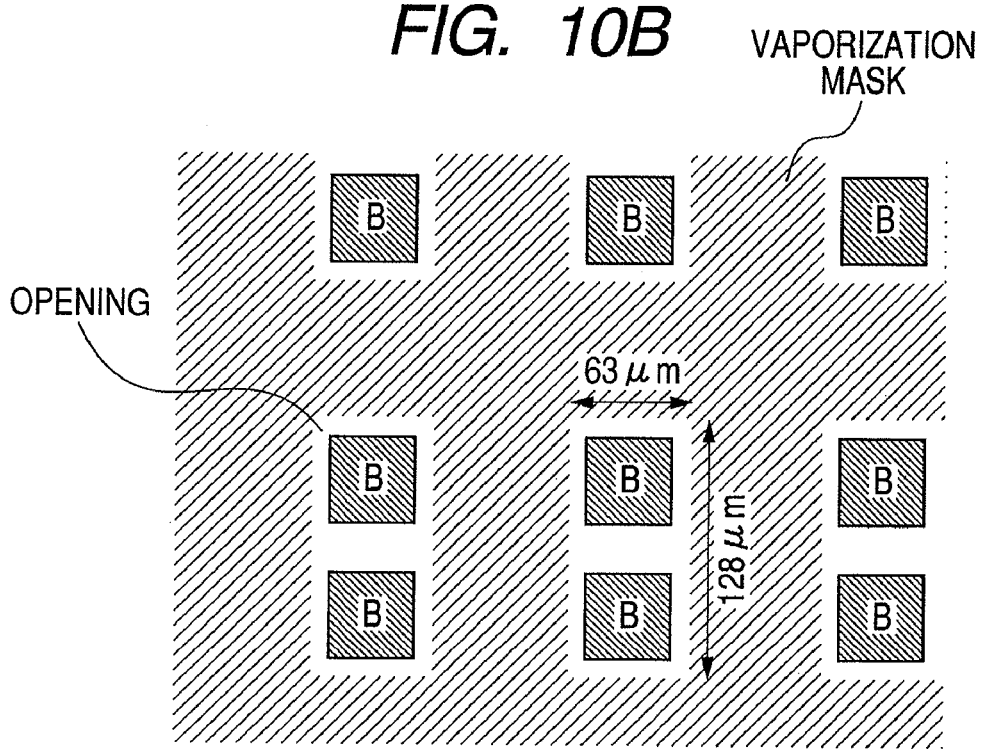
Figure 11:
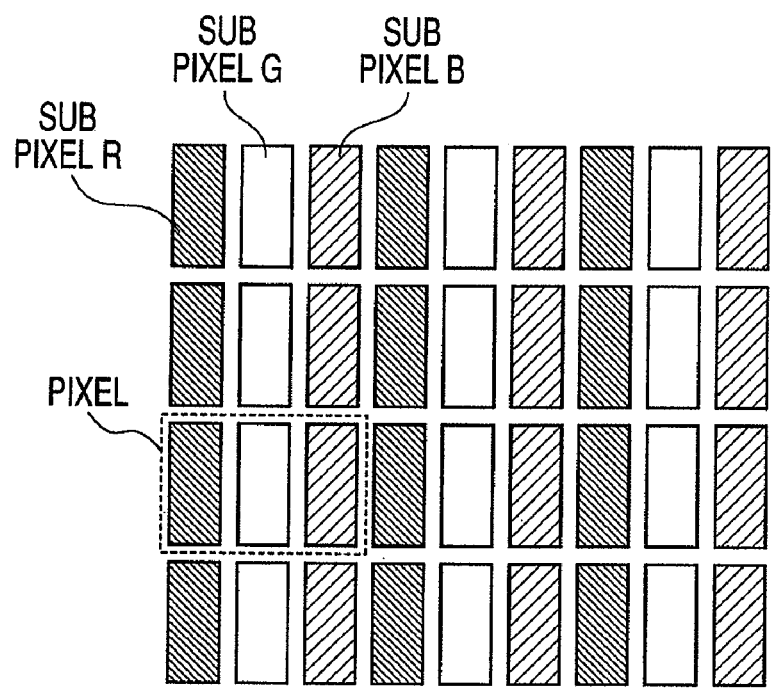
FIG. 11 is a schematic plan view illustrating conventional pixel and sub pixel disposition.
Figure 12:
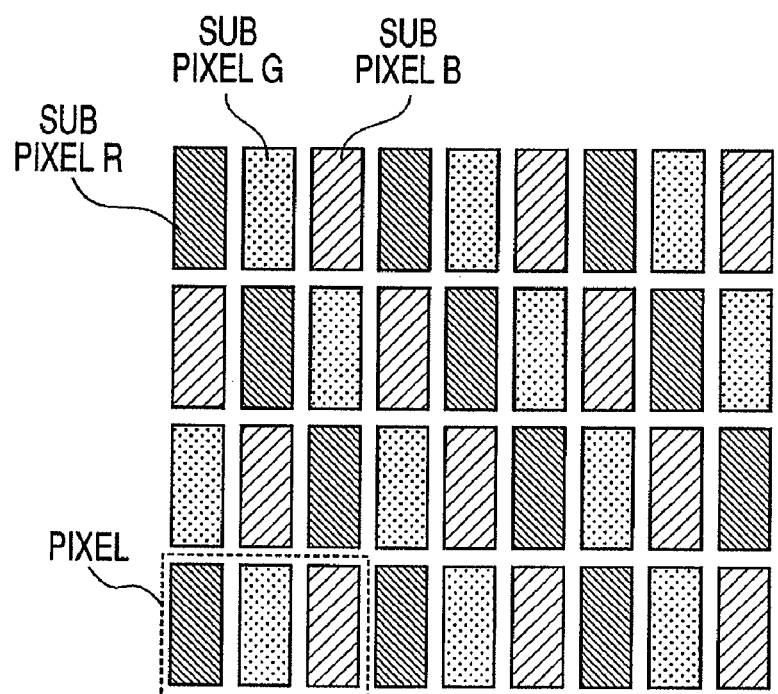
FIG. 12 is a schematic plan view illustrating conventional pixel and sub pixel disposition.
Figure 13:
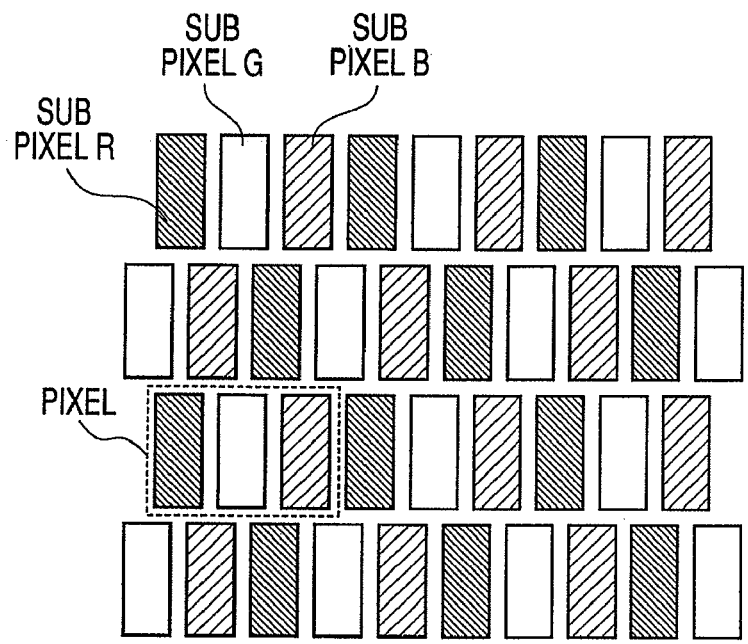
FIG. 13 is a schematic plan view illustrating conventional pixel and sub pixel disposition.
Figure 14A:
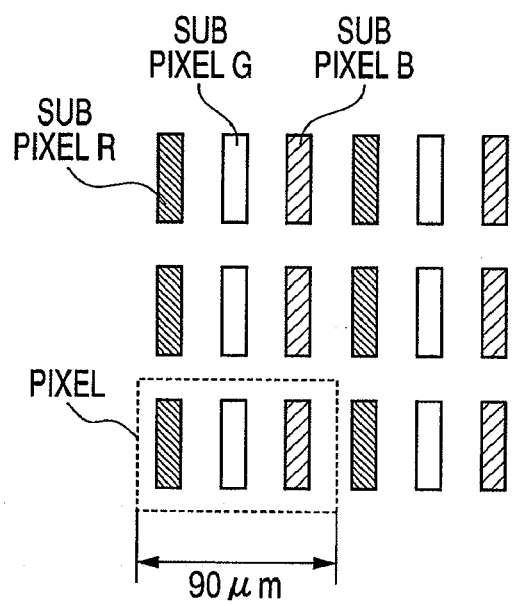
FIG. 14A is a schematic plan view illustrating conventional pixel and sub pixel disposition and FIG. 14B is a schematic plan view illustrating an evaporation mask.
Figure 14B:
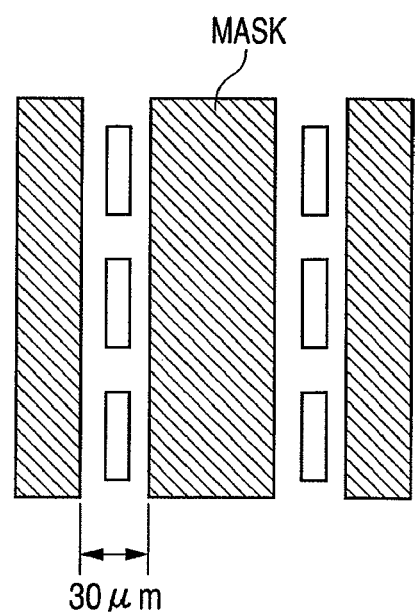
Figure 15A:
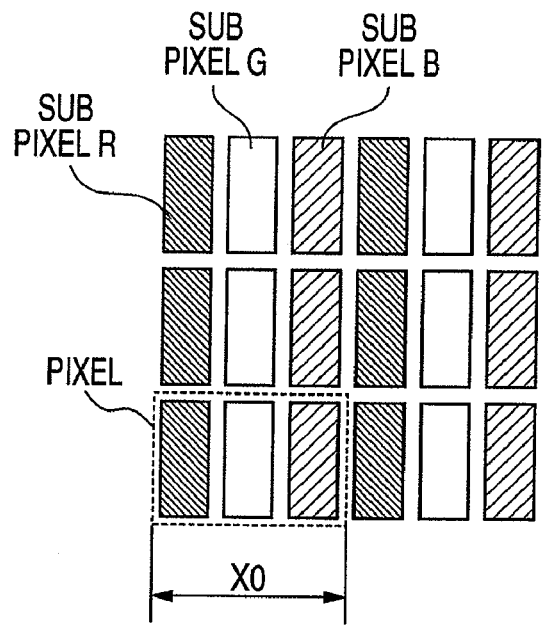
FIGS. 15A and 15B are schematic plan views illustrating conventional pixel and sub pixel disposition.
Figure 15B:
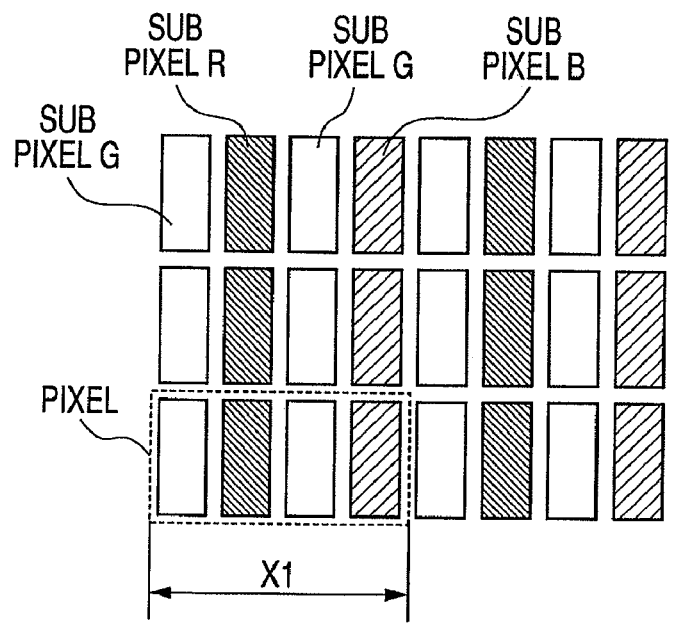
Figure 16A:
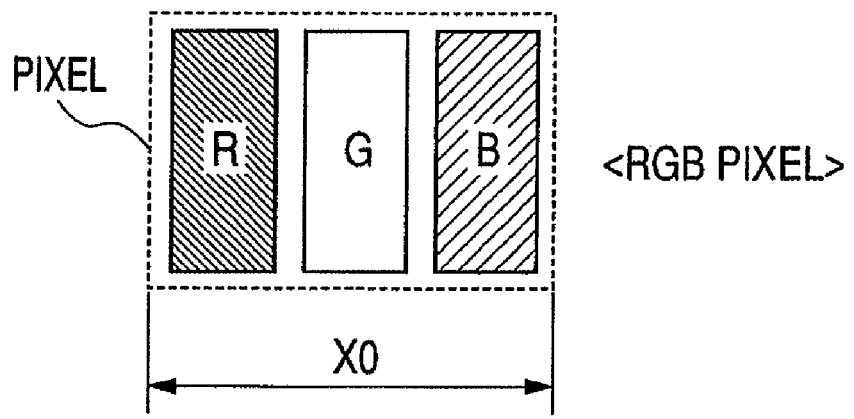
FIGS. 16A and 16B are schematic plan views illustrating conventional pixel and sub pixel disposition.
Figure 16B:
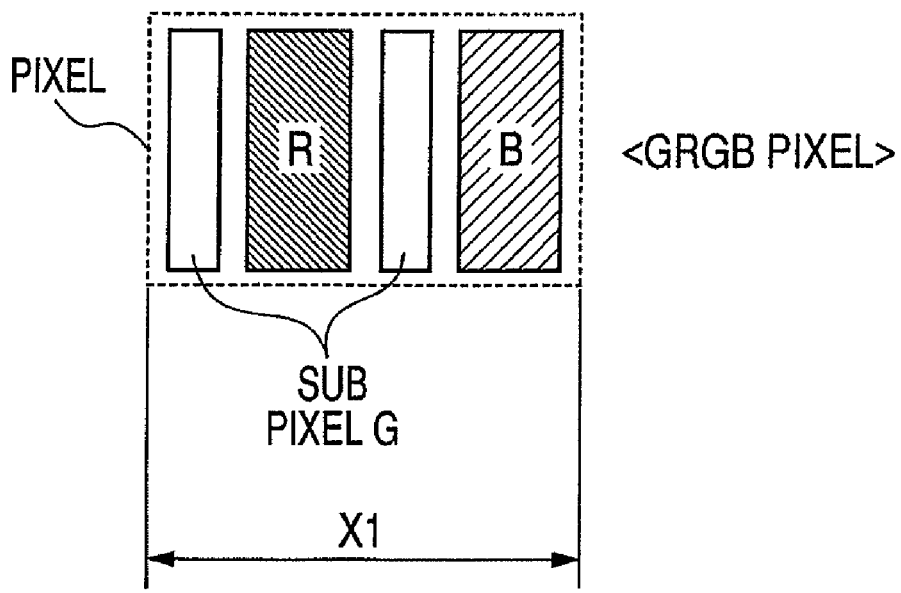

In this example, as illustrated in FIGS. 10A and 10B, a group of R sub pixels and a group of B sub pixels in adjacent pixels can be patterned by using a single mask opening. Therefore, one kind of mask may be prepared to form the R sub pixels and the B sub pixels, with the result that an effect of reducing the production cost is obtained.

Further, by changing the mask disposition (alignment), the red sub pixels and the blue sub pixels can be patterned by using a single mask without the need of mask exchange for each emission color. Therefore, the time required for mask exchange can be reduced, which leads not only to reduction in the production cost but also to reduction of tact time.

Although the display apparatus and the production method thereof according to the present invention have been described with reference to the examples, the present invention is not limited to the examples and can be embodied in various forms.

Although in the examples, the pixel shape is a rectangular shape, various shapes such as a square shape, a parallelogram shape, and a rhomboid shape can be used. Further, although the two G sub pixels have the same shape, different shapes may be employed therefor. For example, in FIGS. 2A and 2B, the length in the vertical direction of the G sub pixel which is located on the upper left hand side in the pixel may be small and the length in the vertical direction of the G sub pixel which is located on the lower right hand side in the pixel may be large. Moreover, although in the Examples, the areas of the three-color sub pixels in each pixel are equal to one another, the areas of the three-color sub pixels may be different from one another. However, when the three-color sub pixels are to be regularly disposed within the display surface, the areas of the three-color sub pixels are desirably made equal to one another.

The display apparatus according to the present invention may be a passive matrix display apparatus in which light is emitted at intersections of stripe electrodes or an active matrix display apparatus in which a switching element for controlling emission/non-emission of light of a sub pixel is formed for each emission color. Incidentally, the two G sub pixels may be driven either independently or in accordance with a common drive signal.

The display apparatus according to the present invention can be used for display units of various electronic equipments. The display apparatus is used for, for example, a television receiver, a personal computer, a mobile phone, a portable audio player, an imaging device (digital camera or digital camcorder), a personal digital assistant (PDA), a car navigation system, and an OA device. In particular, when resolution is to be improved for small electronic devices, there is a limit to a reduction in pixel size. Therefore, the display apparatus according to the present invention can be desirably used for small electronic equipments such as a mobile phone, a portable audio player, an imaging device, and a personal digital assistant.

This application claims the benefit of Japanese Patent Application No. 2007-023825, filed Feb. 2, 2007, and No. 2007-329822, filed Dec. 21, 2007 which are hereby incorporated by reference herein in their entirety.

The invention claimed is:

1. A display apparatus, comprising:
a plurality of pixels disposed in two directions within a display surface, each of the plurality of pixels including a sub pixel for emitting a red light, two sub pixels for emitting a green light, and a sub pixel for emitting a blue light,
wherein the sub pixel for emitting the red light and the sub pixel for emitting the blue light are disposed so as to partially overlap each other in one of the two directions, and the two sub pixels for emitting the green light are disposed distant from each other in the one direction,
wherein for two pixels adjacent to each other in the one direction, the sub pixel for emitting the green light contained in one pixel and the sub pixel for emitting the green light contained in the other pixel are adjacent to each other, and the sub pixel for emitting the blue light contained in the one pixel and the sub pixel for emitting the red light contained in the other pixel are adjacent to each other, and
wherein the pixels adjacent to each other in the other of the two directions have the same sub pixel disposition.

2. The display apparatus according to claim 1, wherein the pixels adjacent to each other in the one direction are disposed so as to be offset by ½ pitch with respect to each other in the other of the two directions.

3. The display apparatus according to claim 1, wherein for the pixels adjacent to each other in the one direction, the sub pixels for emitting the green light are in contact with each other.

4. The display apparatus according to claim 1, which is an organic EL display apparatus having an organic light-emitting layer formed for each emission color.

5. A method of producing a display apparatus which comprises a plurality of pixels disposed in two directions within a display surface and each of the plurality of pixels having a sub pixel for emitting a red light, two sub pixels for emitting a green light, and a sub pixel for emitting a blue light, wherein the sub pixel for emitting the red light and the sub pixel for emitting the blue light are disposed so as to partially overlap each other in one of the two directions, and the two sub pixels for emitting the green light are disposed distant from each other in the one direction, and wherein for the pixels adjacent to each other in the one direction, the sub pixels for emitting the green light are adjacent to each other, the method comprising:
forming the sub pixels for emitting the green light by using a mask having an opening which is common to the adjacent sub pixels for emitting the green light,
wherein for two pixels adjacent to each other in the one direction, the sub pixel for emitting the green light contained in one pixel and the sub pixel for emitting the green light contained in the other pixel are adjacent to each other, and the sub pixel for emitting the blue light contained in the one pixel and the sub pixel for emitting the red light contained in the other pixel are adjacent to each other, and
wherein the pixels adjacent to each other in the other of the two directions have the same sub pixel disposition, the method further comprising forming the sub pixels for emitting the red light, the sub pixels for emitting the green light, and the sub pixels for emitting the blue light, respectively, by using a mask having the same opening pattern.

6. A method of producing a display apparatus which comprises a plurality of pixels disposed in two directions within a display surface and each of the plurality of pixels having a sub pixel for emitting a red light, two sub pixels for emitting a green light, and a sub pixel for emitting a blue light, wherein the sub pixel for emitting the red light and the sub pixel for emitting the blue light are disposed so as to partially overlap each other in one of the two directions, and the two sub pixels for emitting the green light are disposed distant from each other in the one direction, and wherein for the pixels adjacent to each other in the one direction, the sub pixels for emitting the green light are adjacent to each other, the method comprising:
forming the sub pixels for emitting the green light by using a mask having an opening which is common to the adjacent sub pixels for emitting the green light,
wherein for two pixels adjacent to each other in the one direction, the sub pixel for emitting the green light contained in one pixel and the sub pixel for emitting the green light contained in the other pixel are adjacent to each other, and the sub pixel for emitting the blue light contained in the one pixel and the sub pixel for emitting the red light contained in the other pixel are adjacent to each other, and
wherein the pixels adjacent to each other in the other of the two directions have the same sub pixel disposition, the method further comprising forming the sub pixels for emitting the red light, the sub pixels for emitting the green light, and the sub pixels for emitting the blue light, respectively, by using a mask having the same opening pattern and by adjusting mask disposition.

7. The display apparatus according to claim 1, wherein each of the sub pixels for emitting the green light is smaller than both of either the sub pixel for emitting the red light and the sub pixel for emitting the blue light.

8. The display apparatus according to claim 7, wherein a combined size of the sub pixel for emitting green light contained in the one pixel and the sub pixel for emitting the green light contained in the other pixel, which are adjacent to each other, is substantially the same as each of the sub pixel for emitting the red light and the sub pixel for emitting the blue light.

* * * * *